United States Patent
Nelson et al.

(10) Patent No.: US 9,098,435 B1
(45) Date of Patent: Aug. 4, 2015

(54) FINITE IMPULSE RESPONSE FILTER WITH PARALLEL INPUT

(75) Inventors: David S. Nelson, Salt Lake City, UT (US); Scott Talbot, Salt Lake City, UT (US); Ryan Hinton, Draper, UT (US); Osama Haddadin, Salt Lake City, UT (US)

(73) Assignee: L-3 Communciations Corp., New York, NY (US)

( * ) Notice: Subject to any disclaimer, the term of this patent is extended or adjusted under 35 U.S.C. 154(b) by 2089 days.

(21) Appl. No.: 11/540,142

(22) Filed: Sep. 28, 2006

(51) Int. Cl.
*G06F 17/14* (2006.01)
*G06F 7/53* (2006.01)

(52) U.S. Cl.
CPC . *G06F 17/14* (2013.01); *G06F 7/53* (2013.01)

(58) Field of Classification Search
None
See application file for complete search history.

(56) References Cited

U.S. PATENT DOCUMENTS

| | | | |
|---|---|---|---|
| 3,665,171 A * | 5/1972 | Morrow | 708/319 |
| 4,020,332 A | 4/1977 | Crochiere et al. | |
| 4,344,149 A | 8/1982 | van de Meeberg et al. | |
| 4,612,625 A | 9/1986 | Bertrand | |
| 5,339,264 A | 8/1994 | Said et al. | |
| 5,831,879 A * | 11/1998 | Yom et al. | 708/301 |
| 6,009,447 A * | 12/1999 | Kubota et al. | 708/313 |
| 6,370,556 B1 | 4/2002 | Saramaki et al. | |
| 6,427,157 B1 | 7/2002 | Webb | |

OTHER PUBLICATIONS

Ralston, "High speed FIR Filtering with Decimation using Low Speed FIR Filter Chips", International Conference on Signal Processing Applications and Technology, Oct. 1992.

* cited by examiner

*Primary Examiner* — Michael D Yaary
(74) *Attorney, Agent, or Firm* — Kirton | McConkie

(57) ABSTRACT

A filter and method for finite impulse response filtering an input signal is described. In one embodiment, the filter includes an input circuit configured to receive input samples in parallel, where the parallel input samples correspond to sequential samples of the input signal. In another embodiment, the filter includes a coefficient memory configured to store filter response coefficients and output a subset of those coefficients corresponding to a selected decimation factor.

31 Claims, 16 Drawing Sheets

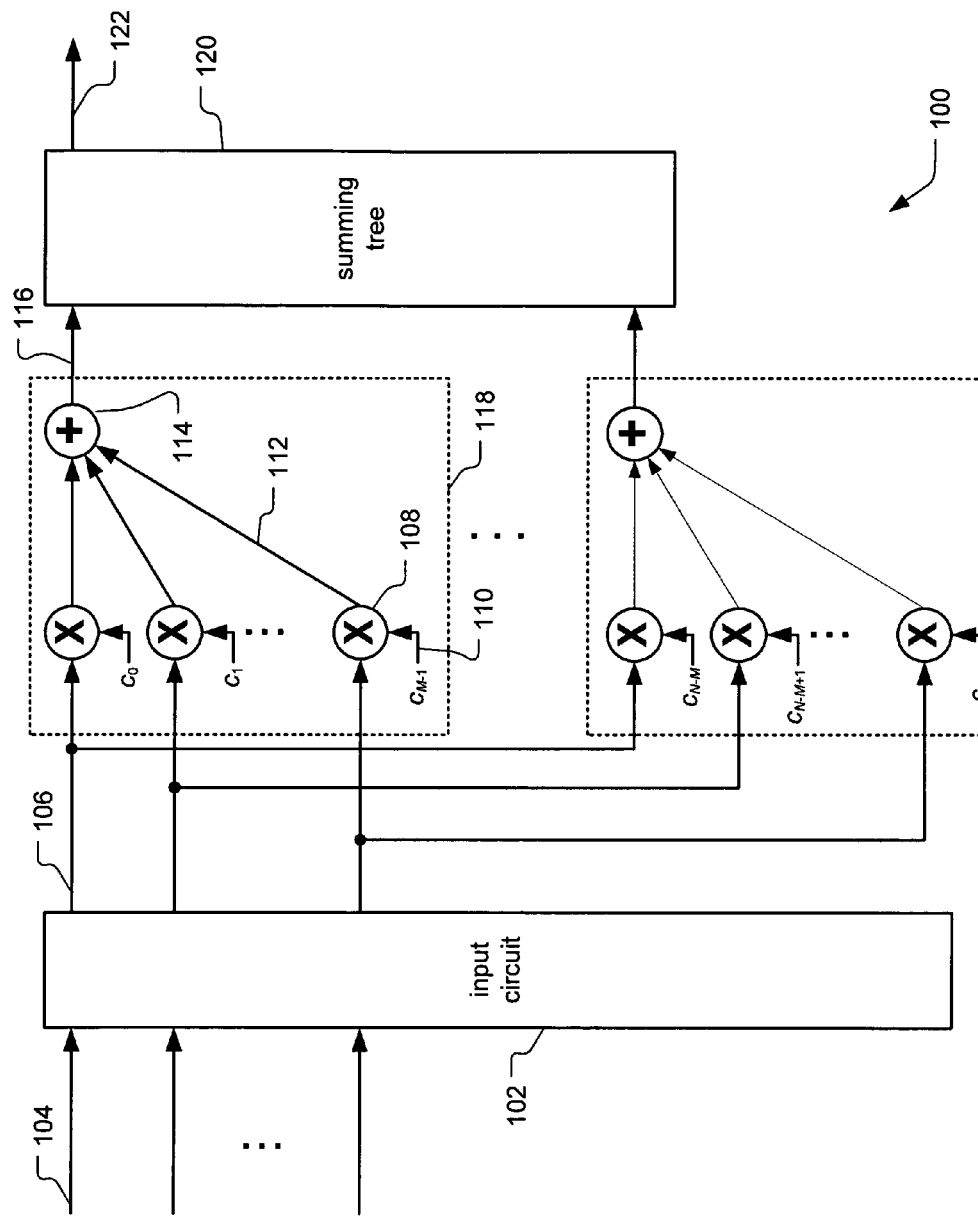

| Time | Signal Samples | Coefficients $c_0\ c_1\ c_2\ c_3\ c_4\ c_5\ c_6\ c_7\ c_8$ | Partial Sum (upper) | Partial Sum (middle) | Partial Sum (lower) | Decimated Filter Output |
|---|---|---|---|---|---|---|
| 1 | $x_0\ x_1\ x_2$ | $h_2\ h_1\ h_0\ h_5\ h_4\ h_3\ h_8\ h_7\ h_6$ | | | $h_8x_0+h_7x_1+h_6x_2$ | |
| 2 | $x_3\ x_4\ x_5$ | " | | $h_5x_3+h_4x_4+h_3x_5$ | | |
| 3 | $x_6\ x_7\ x_8$ | " | $h_2x_6+h_1x_7+h_0x_8$ | | $h_8x_6+h_7x_7+h_6x_8$ | $h_8x_0+h_7x_1+h_6x_2+h_5x_3+h_4x_4+h_3x_5+h_2x_6+h_1x_7+h_0x_8$ |
| 4 | $x_9\ x_{10}\ x_{11}$ | " | | $h_5x_9+h_4x_{10}+h_3x_{11}$ | | |
| 5 | $x_{12}\ x_{13}\ x_{14}$ | " | $h_2x_{12}+h_1x_{13}+h_0x_{14}$ | | $h_8x_{12}+h_7x_{13}+h_6x_{14}$ | $h_8x_6+h_7x_7+h_6x_8+h_5x_9+h_4x_{10}+h_3x_{11}+h_2x_{12}+h_1x_{13}+h_0x_{14}$ |
| 6 | $x_{15}\ x_{16}\ x_{17}$ | " | | $h_5x_{15}+h_4x_{16}+h_3x_{17}$ | | |
| 7 | $x_{18}\ x_{19}\ x_{20}$ | " | $h_2x_{18}+h_1x_{19}+h_0x_{20}$ | | $h_8x_{18}+h_7x_{19}+h_6x_{20}$ | $h_8x_{12}+h_7x_{13}+h_6x_{14}+h_5x_{15}+h_4x_{16}+h_3x_{17}+h_2x_{18}+h_1x_{19}+h_0x_{20}$ |
| 8 | $x_{21}\ x_{22}\ x_{23}$ | " | | $h_5x_{21}+h_4x_{22}+h_3x_{23}$ | | |
| 9 | $x_{24}\ x_{25}\ x_{26}$ | " | $h_2x_{24}+h_1x_{25}+h_0x_{26}$ | | $h_8x_{24}+h_7x_{25}+h_6x_{26}$ | $h_8x_{18}+h_7x_{19}+h_6x_{20}+h_5x_{21}+h_4x_{22}+h_3x_{23}+h_2x_{24}+h_1x_{25}+h_0x_{26}$ |
| 10 | $x_{27}\ x_{28}\ x_{29}$ | " | | $h_5x_{27}+h_4x_{28}+h_3x_{29}$ | | |
| 11 | $x_{30}\ x_{31}\ x_{32}$ | " | $h_2x_{30}+h_1x_{31}+h_0x_{32}$ | | | $h_8x_{24}+h_7x_{25}+h_6x_{26}+h_5x_{27}+h_4x_{28}+h_3x_{29}+h_2x_{30}+h_1x_{31}+h_0x_{32}$ |

*FIG. 6*

| Time | Signal Samples | Coefficients $c_0\ c_1\ c_2\ \ c_3\ c_4\ c_5$ | Partial Sum & Accum. (upper) | Partial Sum (lower) | Accumulator (lower) | Decimated Filter Output |
|---|---|---|---|---|---|---|
| 1 | $x_0\ x_1\ x_2$ | $h_8\ h_7\ h_6$ | | $h_8x_0+h_7x_1+h_6x_2$ | | |
| 2 | $x_3\ x_4\ x_5$ | $h_5\ h_4\ h_3$ | | $h_5x_3+h_4x_4+h_3x_5$ | $h_8x_0+h_7x_1+h_6x_2+h_5x_3+h_4x_4+h_3x_5$ | |
| 3 | $x_6\ x_7\ x_8$ | $h_2\ h_1\ h_0\ \ h_8\ h_7\ h_6$ | $h_2x_6+h_1x_7+h_0x_8$ | $h_8x_6+h_7x_7+h_6x_8$ | | $h_8x_0+h_7x_1+h_6x_2+h_5x_3+h_4x_4+h_3x_5+h_2x_6+h_1x_7+h_0x_8$ |
| 4 | $x_9\ x_{10}\ x_{11}$ | $h_5\ h_4\ h_3$ | | $h_5x_9+h_4x_{10}+h_3x_{11}$ | $h_8x_6+h_7x_7+h_6x_8+h_5x_9+h_4x_{10}+h_3x_{11}$ | |
| 5 | $x_{12}\ x_{13}\ x_{14}$ | $h_2\ h_1\ h_0\ \ h_8\ h_7\ h_6$ | $h_2x_{12}+h_1x_{13}+h_0x_{14}$ | $h_8x_{12}+h_7x_{13}+h_6x_{14}$ | | $h_8x_6+h_7x_7+h_6x_8+h_5x_9+h_4x_{10}+h_3x_{11}+h_2x_{12}+h_1x_{13}+h_0x_{14}$ |
| 6 | $x_{15}\ x_{16}\ x_{17}$ | $h_5\ h_4\ h_3$ | | $h_5x_{15}+h_4x_{16}+h_3x_{17}$ | | |
| 7 | $x_{18}\ x_{19}\ x_{20}$ | $h_2\ h_1\ h_0\ \ h_8\ h_7\ h_6$ | $h_2x_{18}+h_1x_{19}+h_0x_{20}$ | $h_8x_{18}+h_7x_{19}+h_6x_{20}$ | $h_8x_{12}+h_7x_{13}+h_6x_{14}+h_5x_{15}+h_4x_{16}+h_3x_{17}+h_2x_{18}+h_1x_{19}+h_0x_{20}$ | |
| 8 | $x_{21}\ x_{22}\ x_{23}$ | $h_5\ h_4\ h_3$ | | $h_5x_{21}+h_4x_{22}+h_3x_{23}$ | $h_8x_{18}+h_7x_{19}+h_6x_{20}+h_5x_{21}+h_4x_{22}+h_3x_{23}$ | |
| 9 | $x_{24}\ x_{25}\ x_{26}$ | $h_2\ h_1\ h_0\ \ h_8\ h_7\ h_6$ | $h_2x_{24}+h_1x_{25}+h_0x_{26}$ | $h_8x_{24}+h_7x_{25}+h_6x_{26}$ | | $h_8x_{18}+h_7x_{19}+h_6x_{20}+h_5x_{21}+h_4x_{22}+h_3x_{23}+h_2x_{24}+h_1x_{25}+h_0x_{26}$ |
| 10 | $x_{27}\ x_{28}\ x_{29}$ | $h_5\ h_4\ h_3$ | | $h_5x_{27}+h_4x_{28}+h_3x_{29}$ | $h_8x_{24}+h_7x_{25}+h_6x_{26}+h_5x_{27}+h_4x_{28}+h_3x_{29}$ | |
| 11 | $x_{30}\ x_{31}\ x_{32}$ | $h_2\ h_1\ h_0\ \ h_8\ h_7\ h_6$ | $h_2x_{30}+h_1x_{31}+h_0x_{32}$ | | | $h_8x_{24}+h_7x_{25}+h_6x_{26}+h_5x_{27}+h_4x_{28}+h_3x_{29}+h_2x_{30}+h_1x_{31}+h_0x_{32}$ |

FIG. 8

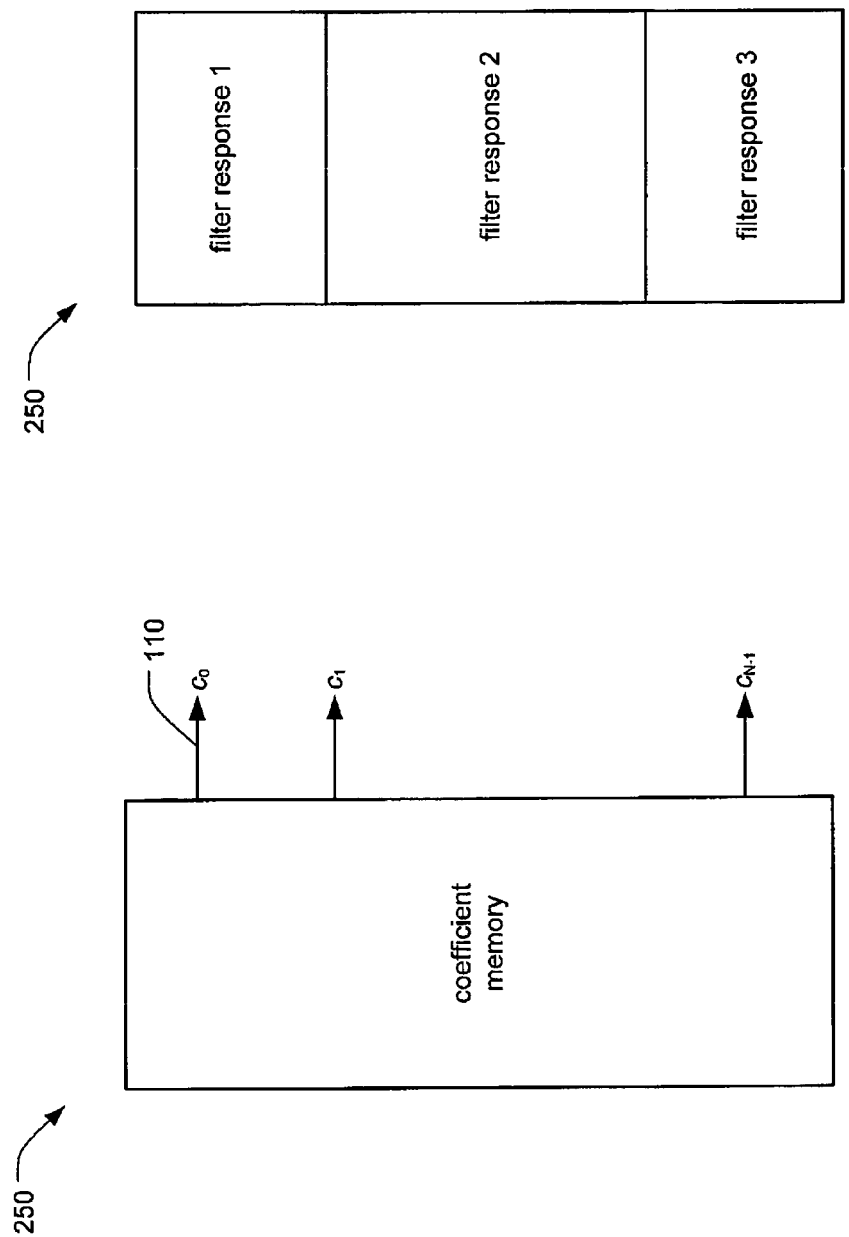

| Time | Signal Samples | Coefficients $c_0\ c_1\ c_2\ c_3$ | Products $p_0\ p_1\ p_2\ p_3$ | Multiplexer Selections | Accumulator $A_0$ | Accumulator $A_1$ | Accumulator $A_2$ | Accumulator $A_3$ | Out |
|---|---|---|---|---|---|---|---|---|---|
| 1 | $x_0\ x_1\ x_2\ x_3$ | $h_0\ h_0\ h_0\ h_0$ | $h_0x_0\ h_0x_1\ h_0x_2\ h_0x_3$ | $p_3\ p_0\ p_1\ p_2$ | $h_0x_3$ | | | | |
| 2 | | $h_1\ h_1\ h_1\ h_1$ | $h_1x_0\ h_1x_1\ h_1x_2\ h_1x_3$ | $p_2\ p_3\ p_0\ p_1$ | $h_1x_2+h_0x_3$ | $h_1x_3$ | | | |
| 3 | | $h_2\ h_2\ h_2\ h_2$ | $h_2x_0\ h_2x_1\ h_2x_2\ h_2x_3$ | $p_1\ p_2\ p_3\ p_0$ | $h_2x_1+h_1x_2+h_0x_3$ | $h_2x_2+h_1x_3$ | $h_2x_3$ | | |
| 4 | | $h_3\ h_3\ h_3\ h_3$ | $h_3x_0\ h_3x_1\ h_3x_2\ h_3x_3$ | $p_0\ p_1\ p_2\ p_3$ | $h_3x_0+h_2x_1+h_1x_2+h_0x_3$ | $h_3x_1+h_2x_2+h_1x_3$ | $h_3x_2+h_2x_3$ | $h_3x_3$ | $A_0$ |
| 5 | $x_4\ x_5\ x_6\ x_7$ | $h_0\ h_0\ h_0\ h_0$ | $h_0x_4\ h_0x_5\ h_0x_6\ h_0x_7$ | $p_3\ p_0\ p_1\ p_2$ | $h_0x_7$ | $h_3x_1+h_2x_2+h_1x_3+h_0x_4$ | $h_3x_2+h_2x_3\ +h_0x_5$ | $h_3x_3+\ +h_0x_6$ | $A_1$ |
| 6 | | $h_1\ h_1\ h_1\ h_1$ | $h_1x_4\ h_1x_5\ h_1x_6\ h_1x_7$ | $p_2\ p_3\ p_0\ p_1$ | $h_1x_6+h_0x_7$ | $h_1x_7$ | $h_3x_2+h_2x_3+h_1x_4+h_0x_5$ | $h_3x_3+\ +h_0x_6$ | $A_2$ |
| 7 | | $h_2\ h_2\ h_2\ h_2$ | $h_2x_4\ h_2x_5\ h_2x_6\ h_2x_7$ | $p_1\ p_2\ p_3\ p_0$ | $h_2x_5+h_1x_6+h_0x_7$ | $h_2x_6+h_1x_7$ | $h_2x_7$ | $h_3x_3+h_2x_4+h_1x_5+h_0x_6$ | $A_3$ |
| 8 | | $h_3\ h_3\ h_3\ h_3$ | $h_3x_4\ h_3x_5\ h_3x_6\ h_3x_7$ | $p_0\ p_1\ p_2\ p_3$ | $h_3x_4+h_2x_5+h_1x_6+h_0x_7$ | $h_3x_5+h_2x_6+h_1x_7$ | $h_3x_6+h_2x_7$ | $h_3x_7$ | $A_0$ |
| 9 | $x_8\ x_9\ x_{10}\ x_{11}$ | $h_0\ h_0\ h_0\ h_0$ | $h_0x_8\ h_0x_9\ h_0x_{10}\ h_0x_{11}$ | $p_3\ p_0\ p_1\ p_2$ | $h_0x_{11}$ | $h_3x_5+h_2x_6+h_1x_7+h_0x_8$ | $h_3x_6+h_2x_7\ +h_0x_9$ | $h_3x_7+\ +h_0x_{10}$ | $A_1$ |
| 10 | | $h_1\ h_1\ h_1\ h_1$ | $h_1x_8\ h_1x_9\ h_1x_{10}\ h_1x_{11}$ | $p_2\ p_3\ p_0\ p_1$ | $h_1x_{10}+h_0x_{11}$ | | $h_3x_6+h_2x_7+h_1x_8+h_0x_9$ | $h_3x_7+\ +h_1x_0+h_0x_{10}$ | $A_2$ |
| 11 | | $h_2\ h_2\ h_2\ h_2$ | $h_2x_8\ h_2x_9\ h_2x_{10}\ h_2x_{11}$ | $p_1\ p_2\ p_3\ p_0$ | $h_2x_9+h_1x_{10}+h_0x_{11}$ | | | $h_3x_7+h_2x_8+h_1x_0+h_0x_{10}$ | $A_3$ |
| 12 | | $h_3\ h_3\ h_3\ h_3$ | $h_3x_8\ h_3x_9\ h_3x_{10}\ h_3x_{11}$ | $p_0\ p_1\ p_2\ p_3$ | $h_3x_8+h_2x_9+h_1x_{10}+h_0x_{11}$ | | | | $A_0$ |

FIG. 13

| Time | Signal Samples | Coefficients $c_0\ c_1\ c_2\ c_3$ | Products $p_0\ p_1\ p_2\ p_3$ | Multiplexer Selections $(A_0, A_1)$ | Accum. $A_0$ | Accum. $A_1$ | Out |
|---|---|---|---|---|---|---|---|
| 1 | $x_0\ x_1\ x_2\ x_3$ | $h_0\ h_0\ h_0\ h_0$ | $h_0x_0\ h_0x_1\ h_0x_2\ h_0x_3$ | $p_3$ | $h_0x_3$ | | |
| 2 | | $h_1\ h_1\ h_1\ h_1$ | $h_1x_0\ h_1x_1\ h_1x_2\ h_1x_3$ | $p_2$ | $h_1x_2+h_0x_3$ | | |
| 3 | | $h_2\ h_2\ h_2\ h_2$ | $h_2x_0\ h_2x_1\ h_2x_2\ h_2x_3$ | $p_1$ | $h_2x_1+h_1x_2+h_0x_3$ | | |
| 4 | | $h_3\ h_3\ h_3\ h_3$ | $h_3x_0\ h_3x_1\ h_3x_2\ h_3x_3$ | $p_0\ p_3$ | $h_3x_0+h_2x_1+h_1x_2+h_0x_3$ | $h_3x_3$ | $A_0$ |
| 5 | $x_4\ x_5\ x_6\ x_7$ | $h_0\ h_0\ h_0\ h_0$ | $h_0x_4\ h_0x_5\ h_0x_6\ h_0x_7$ | $p_2$ | | $h_3x_3\ +h_0x_6$ | |
| 6 | | $h_1\ h_1\ h_1\ h_1$ | $h_1x_4\ h_1x_5\ h_1x_6\ h_1x_7$ | $p_1$ | | $h_3x_3\ +h_1x_5+h_0x_6$ | $A_1$ |
| 7 | | $h_2\ h_2\ h_2\ h_2$ | $h_2x_4\ h_2x_5\ h_2x_6\ h_2x_7$ | $p_3\ p_0$ | $h_2x_7$ | $h_3x_3+h_2x_4+h_1x_5+h_0x_6$ | |
| 8 | | $h_3\ h_3\ h_3\ h_3$ | $h_3x_4\ h_3x_5\ h_3x_6\ h_3x_7$ | $p_2$ | $h_3x_6+h_2x_7$ | | |
| 9 | $x_8\ x_9\ x_{10}\ x_{11}$ | $h_0\ h_0\ h_0\ h_0$ | $h_0x_8\ h_0x_9\ h_0x_{10}\ h_0x_{11}$ | $p_1$ | $h_3x_6+h_2x_7\ +h_0x_9$ | | $A_0$ |
| 10 | | $h_1\ h_1\ h_1\ h_1$ | $h_1x_8\ h_1x_9\ h_1x_{10}\ h_1x_{11}$ | $p_0\ p_3$ | $h_3x_6+h_2x_7+h_1x_8+h_0x_9$ | $h_1x_{11}$ | |
| 11 | | $h_2\ h_2\ h_2\ h_2$ | $h_2x_8\ h_2x_9\ h_2x_{10}\ h_2x_{11}$ | $p_2$ | | $h_2x_{10}+h_1x_{11}$ | |
| 12 | | $h_3\ h_3\ h_3\ h_3$ | $h_3x_8\ h_3x_9\ h_3x_{10}\ h_3x_{11}$ | $p_1$ | | $h_3x_9+h_2x_{10}+h_1x_{11}$ | $A_1$ |
| 13 | $x_{12}\ x_{13}\ x_{14}\ x_{15}$ | $h_0\ h_0\ h_0\ h_0$ | $h_0x_{12}\ h_0x_{13}\ h_0x_{14}\ h_0x_{15}$ | $p_3\ p_0$ | $h_0x_{15}$ | $h_3x_9+h_2x_{10}+h_1x_{11}+h_0x_{12}$ | |
| 14 | | $h_1\ h_1\ h_1\ h_1$ | $h_1x_{12}\ h_1x_{13}\ h_1x_{14}\ h_1x_{15}$ | $p_2$ | $h_1x_{14}+h_0x_{15}$ | | |
| 15 | | $h_2\ h_2\ h_2\ h_2$ | $h_2x_{12}\ h_2x_{13}\ h_2x_{14}\ h_2x_{15}$ | $p_1$ | $h_2x_{13}+h_1x_{14}+h_0x_{15}$ | | |
| 16 | | $h_3\ h_3\ h_3\ h_3$ | $h_3x_{12}\ h_3x_{13}\ h_3x_{14}\ h_3x_{15}$ | $p_0\ p_3$ | $h_3x_{12}+h_2x_{13}+h_1x_{14}+h_0x_{15}$ | | $A_0$ |

*FIG. 16*

| Time | Signal Samples | Coefficients $c_0\,c_1\,c_2\,c_3$ | Products $p_0\;p_1\;p_2\;p_3$ | Mux Select'n | Accumulator $A_0$ | Accumulator $A_1$ | Accumulator $A_2$ | Out |
|---|---|---|---|---|---|---|---|---|
| 1 | $x_0\,x_1\,x_2\,x_3$ | - - - $h_2$ | $h_2x_3$ | $p_3$ - - | $h_2x_3$ | | | |
| 2 | | - - $h_3$ - | $h_3x_2$ | $p_2$ - - | $h_3x_2+h_2x_3$ | | | |
| 3 | | - $h_4$ - $h_4$ | $h_4x_1$ $h_4x_3$ | $p_1\,p_3$ - | $h_4x_1+h_3x_2+h_2x_3$ | $h_4x_3$ | | |
| 4 | | $h_5$ - $h_5$ - | $h_5x_0$ $h_5x_2$ | $p_0\,p_2$ - | $h_5x_0+h_4x_1+h_3x_2+h_2x_3$ | $h_5x_2+h_4x_3$ | | |
| 5 | $x_4\,x_5\,x_6\,x_7$ | $h_3\,h_0$ - $h_2$ | $h_3x_4\;h_0x_5\;\;\;\;\;h_2x_7$ | $p_1\,p_0p_3$ | $h_5x_0+h_4x_1+h_3x_2+h_2x_3\;\;+h_0x_5$ | $h_3x_2+h_4x_3+h_3x_4$ | $h_2x_7$ | $A_0$ |
| 6 | | $h_1\,h_2\,h_3$ - | $h_1x_4\;h_2x_5\;h_3x_6$ | $p_0p_1p_2$ | $h_5x_0+h_4x_1+h_3x_2+h_2x_3+h_1x_4+h_0x_5$ | $h_5x_2+h_4x_3+h_3x_4+h_2x_5$ | $h_3x_6+h_2x_7$ | |
| 7 | | - $h_4\,h_1\,h_4$ | $h_4x_5\;h_1x_6\;h_4x_7$ | $p_3\,p_2\,p_1$ | $h_4x_7$ | $h_5x_2+h_4x_3+h_3x_4+h_2x_5+h_1x_6$ | $h_4x_5+h_3x_6+h_2x_7$ | $A_1$ |
| 8 | | $h_5$ - $h_5\,h_0$ | $h_5x_4\;\;\;\;\;\;h_5x_6\;h_0x_7$ | $p_2\,p_3\,p_0$ | $h_5x_6+h_0x_7$ | $h_5x_2+h_4x_3+h_3x_4+h_2x_5+h_1x_6+h_0x_7$ | $h_5x_4+h_4x_5+h_3x_6+h_2x_7$ | |
| 9 | $x_8\,x_9\,x_{10}\,x_{11}$ | $h_3\,h_0$ - $h_2$ | $h_3x_8\;h_0x_9\;\;\;\;\;h_2x_{11}$ | $p_0p_3p_2$ | $h_5x_6+h_4x_7+h_3x_8$ | $h_2x_{11}$ | $h_5x_4+h_4x_5+h_3x_6+h_2x_7\;\;+h_0x_9$ | $A_2$ |
| 10 | | $h_1\,h_2\,h_3$ - | $h_1x_8\;h_2x_9\;h_3x_{10}$ | $p_1\,p_2\,p_0$ | $h_5x_6+h_4x_7+h_3x_8+h_2x_9+h_1x_{10}$ | $h_3x_{10}+h_2x_{11}$ | $h_5x_4+h_4x_5+h_3x_6+h_2x_7+h_1x_8+h_0x_9$ | $A_0$ |
| 11 | | - $h_4\,h_1\,h_4$ | $h_4x_9\;h_1x_{10}\;h_4x_{11}$ | $p_2\,p_1\,p_3$ | $h_5x_6+h_4x_7+h_3x_8+h_2x_9+h_1x_{10}+h_0x_{11}$ | $h_5x_8+h_3x_{10}+h_2x_{11}$ | $h_4x_{11}$ | |
| 12 | | $h_5$ - $h_5\,h_0$ | $h_5x_8\;\;\;\;\;h_5x_{10}\;h_0x_{11}$ | $p_3\,p_0\,p_2$ | $h_5x_8$ | $h_5x_8+h_4x_9+h_3x_{10}+h_2x_{11}$ | $h_4x_{11}$ | $A_1$ |
| 13 | $x_{12}\,x_{13}\,x_{14}\,x_{15}$ | $h_3\,h_0$ - $h_2$ | $h_3x_{12}\;h_0x_{13}\;\;\;\;\;h_2x_{15}$ | $p_3\,p_1\,p_0$ | $h_2x_{15}$ | $h_5x_8+h_4x_9+h_3x_{10}+h_2x_{11}\;\;+h_0x_{13}$ | $h_5x_{10}+h_4x_{11}$ | |
| 14 | | $h_1\,h_2\,h_3$ - | $h_1x_{12}\;h_2x_{13}\;h_3x_{14}$ | $p_2\,p_0\,p_1$ | $h_3x_{14}+h_2x_{15}$ | $h_5x_8+h_4x_9+h_3x_{10}+h_2x_{11}+h_1x_{12}+h_0x_{13}$ | $h_5x_{10}+h_4x_{11}+h_3x_{12}+h_2x_{13}$ | $A_2$ |
| 15 | | - $h_4\,h_1\,h_4$ | $h_4x_{13}\;h_1x_{14}\;h_4x_{15}$ | $p_1\,p_3\,p_2$ | $h_4x_{13}+h_3x_{14}+h_2x_{15}$ | $h_4x_{15}$ | $h_5x_{10}+h_4x_{11}+h_3x_{12}+h_2x_{13}+h_1x_{14}$ | |
| 16 | | $h_5$ - $h_5\,h_0$ | $h_5x_{12}\;\;\;\;\;h_5x_{14}\;h_0x_{15}$ | $p_0\,p_2\,p_3$ | $h_5x_{12}+h_4x_{13}+h_3x_{14}+h_2x_{15}$ | $h_5x_{14}+h_4x_{15}$ | $h_5x_{10}+h_4x_{11}+h_3x_{12}+h_2x_{13}+h_1x_{14}+h_0x_{15}$ | $A_2$ |

*FIG. 17*

FINITE IMPULSE RESPONSE FILTER WITH PARALLEL INPUT

FIELD OF THE INVENTION

The present invention relates generally to filtering. More particularly, the present invention relates to finite impulse response filtering.

BACKGROUND

Finite impulse response (FIR) filters have proven especially useful in digital signal processing (DSP) applications. For example, it is known that FIR filters can be used to perform sampling rate changes in time-sampled systems, through decimation and interpolation.

Different forms for implementing FIR filters are known which may be adapted to software or hardware implementations. For example, in a so-called direct form FIR filter, input data samples are stored in a delay line, and the filter output is computed by forming a weighted sum of input data samples from different times. The weighting factors are the filter coefficients of the FIR filter, and are the filter impulse response. In contrast, in a so-called transpose form FIR filter, each input sample is simultaneously multiplied by the different coefficients, and then the different products are delayed relative to each other and summed to form the filter output.

In general, the direct and transpose form FIR implementations require approximately the same number of multipliers, delays, and adders. Specifically, one multiplier for each of the filter impulse response coefficients is usually required for either form. On one hand, this can be an advantage for high speed operation, in that the filter can operate at the maximum sample clock supported by the multiplier. Longer filters can be implemented by using additional multipliers. On the other hand, when the sample rate is lower, or decimation is performed, such high performance may not be needed. Multipliers can consume significant resources in hardware implementations, and it is therefore often desirable to minimize the number of multipliers used.

Considering for example a decimating FIR filter, decimation is performed by keeping only some of the output samples that would ordinarily be produced at the output of the filter. For example, decimation by two can halve the sample rate by taking only every other output sample from the filter and discarding the others. Since it is inefficient to compute output samples which are then discarded, only the desired outputs need be computed. This can be used to either reduce the number of multipliers or to reduce the speed at which the multipliers must operate. For example, one simple implementation of a decimating filter uses a single multiplier and accumulator. As each input sample arrives, it is multiplied by an appropriate coefficient and accumulated into a sum. The multiplier thus operates at the input sample rate. This implementation, however, suffers from the disadvantage that the length of the filter must be less than the decimation factor. Although this disadvantage can be avoided by placing input samples into a memory and allowing the multiplier to compute overlapping sums, this has the disadvantage of increasing the clock rate of the multiplier and requiring the additional complexity of the input sample memory and associated addressing.

An alternate implementation of a decimating filter is the so-called polyphase filter. In a polyphase filter, an input commutator distributes samples to one of several delay lines, where the number of delay lines is equal to the decimation factor. The filter output is computed as the sum of products, where the samples in each delay line are multiplied by a corresponding filter coefficient to produce products, all of which are summed together (the so-called direct form filter). Each of the delay lines and multipliers can run at a fraction of the input sample rate. The polyphase filter thus allows the multipliers to run at a lower clock rate, but suffers the disadvantage of requiring a number of multipliers equal to the filter length. Polyphase filters can suffer an additional disadvantage that their structure is tied to the decimation factor. Changing the decimation factor requires the input commutator and number of delay lines to also be changed. Hence, polyphase filters can be difficult to implement in hardware with programmable decimation factors, and changing the decimation factor during operation is difficult. Finally, polyphase filters can be inefficient when the decimation factor is high and the filter length is long. Many multipliers are required, due to the long filter length, but they only need to run infrequently, due to the high decimation factor. Hence, large amounts of resources are used very inefficiently. Circuitry can be added to permit sharing of multipliers for multiple input samples, but this requires additional complexity in the input sample multiplexing and coefficient memory addressing.

Finally, very high rate input sample rates can present a challenge to the design of a FIR filter. Even when the output rate of the FIR filter is low (because a high decimation factor is present), many input samples must be stored and processed by the filter. The input circuitry of the FIR filter must therefore run at the input sample rate. Although the processing speed of programmable gate arrays, custom hardware, and processors continues to improve each year, the sample rate requirements of some applications can press beyond the ability of the available components. For example, even though currently available field programmable gate arrays can operate at clock rates greater than 120 MHz, sample rates of many times this, for instance 480 MHz, can be difficult to accommodate.

SUMMARY OF THE INVENTION

It has been recognized that it would be advantageous to develop a finite impulse response (FIR) filter than can accommodate high sample rates. It has further been recognized that it would be advantageous to develop a FIR filter than can provide a flexible decimation factor.

In a first embodiment, the invention includes a decimating transpose form finite impulse response filter for filtering an input signal. The filter may include an input circuit configured to receive parallel signal samples, where the parallel signal samples correspond to sequential samples of the input signal. The filter may also include multipliers which multiply the parallel input samples by filter coefficients to produce products. The filter may also include summers which produce partial sums, where the partial sums are a sum of products corresponding to different input samples. The filter may also include a summing tree which differentially delays and sums the partial sums to form a decimated filter output.

A second embodiment of the invention includes a flexible transpose form finite impulse response filter for filtering an input signal. The filter may include an input circuit and multipliers as described above. The filter may also include multiplexers coupled to the multipliers which each selected one product to form a multiplexed product. The filter may also include accumulators which accumulate the multiplexed products to form filter outputs.

A third embodiment of the invention includes a decimating transpose form finite impulse response filter for filtering and decimating an input signal by a decimation factor selected from a plurality of decimation factors. The filter may include an input circuit configured to receive input samples. The filter may also include multipliers to multiply each input sample by selected filter coefficients. The filter may also include a summing tree to differentially delay and sum the products to form the filter output. The filter may also include a coefficient memory which stores filter response coefficients and outputs selected filter coefficients based on the selected decimation factor.

A fourth embodiment of the invention includes a method of decimating an input signal by a decimation factor. A fifth embodiment of the invention includes a method of filtering an input signal by a filter having a desired impulse response.

Additional features and advantages of the invention will be apparent from the detailed description which follows, taken in conjunction with the accompanying drawings, which together illustrate, by way of example, features of the invention.

BRIEF DESCRIPTION OF THE DRAWINGS

FIG. 1 is a block diagram of a decimating transpose form finite impulse response filter in accordance with an embodiment of the present invention;

FIG. 6 is an illustration of one mode of operation of the filter of FIG. 1 in accordance with an embodiment of the present invention;

FIG. 8 is an illustration of one mode of operation of the filter of FIG. 7 in accordance with an embodiment of the present invention;

FIG. 9 is a block diagram of a coefficient memory in accordance with an embodiment of the present invention;

FIG. 11 is a block diagram of a coefficient memory in accordance with an embodiment of the present invention;

FIG. 13 is an illustration of one mode of operation of the filter of FIG. 12 in accordance with an embodiment of the present invention;

FIG. 16 is an illustration of another mode of operation of the filter of FIG. 12 in accordance with an embodiment of the present invention;

FIG. 17 is an illustration of yet another mode of operation of the filter of FIG. 12 in accordance with an embodiment of the present invention;

DETAILED DESCRIPTION

Figure 4:
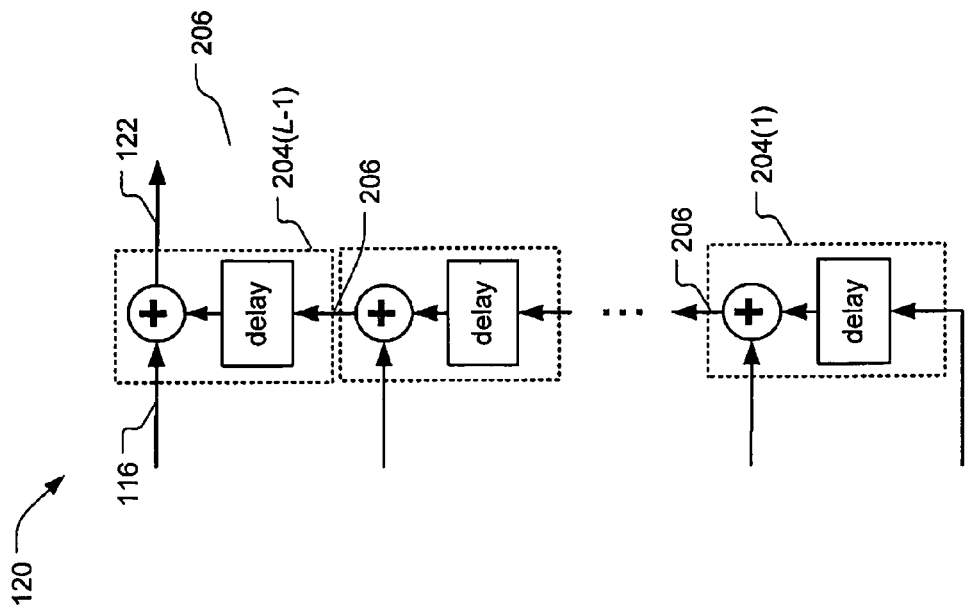
FIG. 4 is a block diagram of a summing tree in accordance with an embodiment of the present invention.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

FIG. 1 illustrates a decimating transpose form finite impulse response filter 100, in accordance with an embodiment of the present invention. The filter provides for the filtering and decimating of an input signal. The input signal is represented in a sampled form, sometimes referred to as a discrete time signal. For example, the input signal can consist of digital samples taken by an analog to digital converter.

Figure 2:
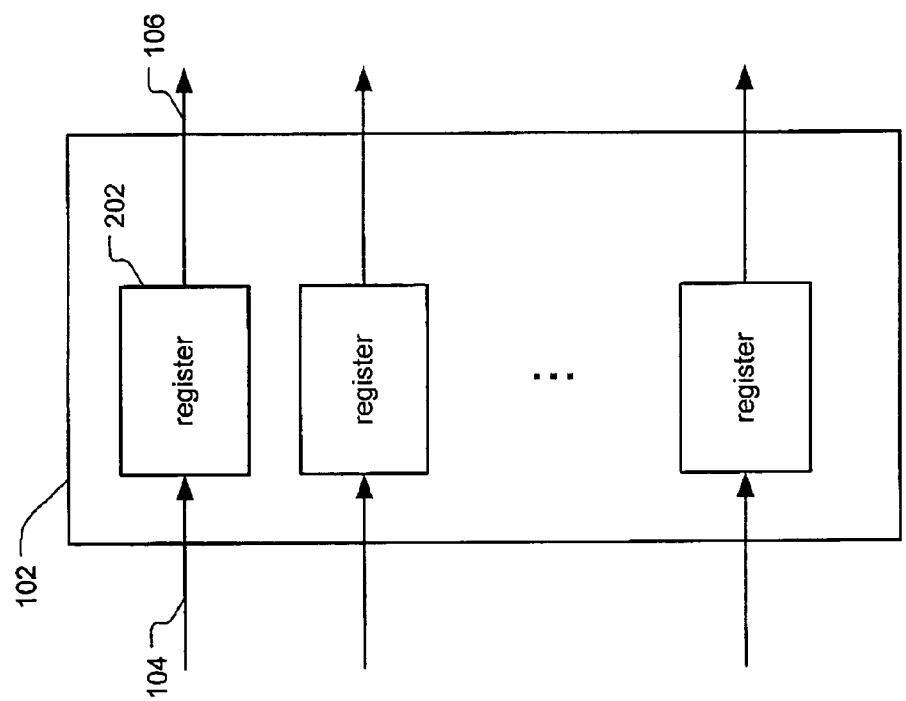
FIG. 2 is a block diagram of an input circuit in accordance with an embodiment of the present invention.
Figure 3:
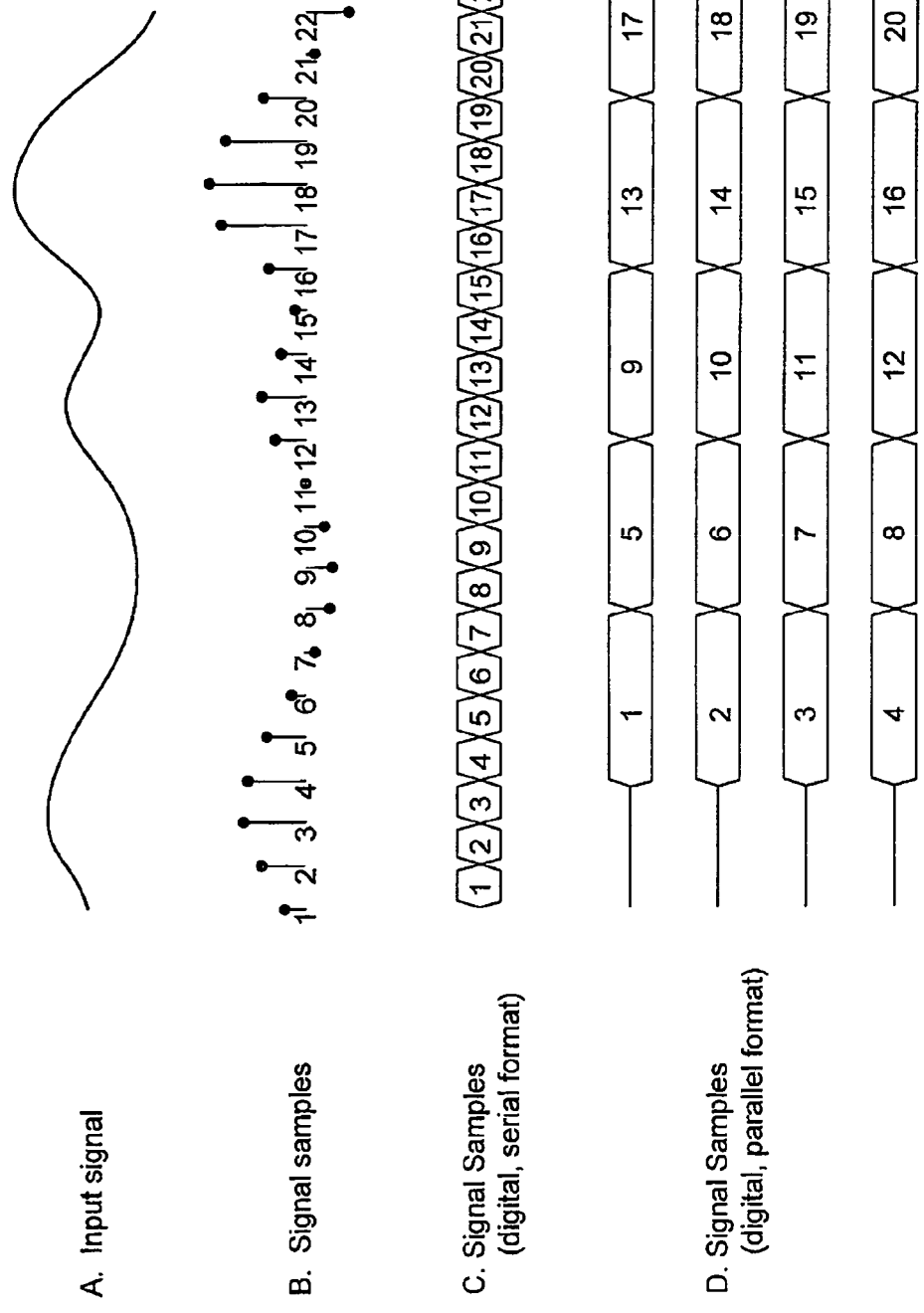
FIG. 3 is a timing diagram of an input signal and corresponding signal samples in serial and parallel format.

The filter includes an input circuit 102 which is configured to receive in parallel multiple signal samples 104. For example, the input circuit may include a plurality of registers 202 or latches which hold the signal samples, as illustrated in FIG. 2 in accordance with an embodiment of the present invention. The signal samples correspond to sequential samples of the input signal. For example, FIG. 3 illustrates an input signal (line A) and corresponding signal samples (line B). The signal samples may be presented in a serial digital format (line C), or groups of signal samples may be presented in parallel format (line D). For example, a high speed serial sample stream may be converted to a plurality of lower speed parallel sample streams by a serial to parallel converter. Alternately, signal samples can be output in a parallel format by certain types of analog to digital converters. Or, as another example, some signal processing systems may require digital filtering for which signal samples are already available in a parallel format, such as when samples are available in a memory from which multiple samples can be retrieved simultaneously.

Continuing the discussion of the filter 100 (FIG. 1) operation, the parallel-received signal samples 106 are provided to a plurality of multipliers 108, which multiply the parallel-received signal samples by the filter coefficients 110 to form products 112. The filter coefficients define the impulse response of the filter, as is discussed further below. A plurality of summers 114 sum the products formed from different parallel-received signal samples to form partial sums 116. In other words, each partial sum includes a contribution from each of the parallel-received signal samples. A summer and the group of multipliers connected to it will be referred to as a filter section 118.

The partial sums 116 from the filter sections 118 are provided to a summing tree 120, which differentially delays and sums the partial sums to form a decimated filter output 122. By differentially delaying the partial sums before addition, the summing tree properly aligns the products of coefficients and signal samples so that the desired filter response is achieved. For example, the summing tree may be implemented as a plurality of daisy-chained delay-and-add units 204 as illustrated in FIG. 4, in accordance with an embodiment of the present invention. Starting at one end of the summing tree (the bottom in FIG. 4), at a first delay-and-add unit 204(1), a first partial sum is delayed and added to a second partial sum to form a partial result 206. At each succeeding delay-and-add unit, the partial result is delayed and summed with the next partial sum. The last delay-and-add unit 204(L−1) (the top in FIG. 4) outputs the decimated filter output 122, where L is the number of filter sections, and hence L−1 delay-and-add units are used. Of course various other arrangements of the delay-and-add unit can be used in the daisy-chain to provide the same effect as will occur to one of skill in the art.

One significant benefit provided by the filter 100 (FIG. 1) is a reduction in the required clock rate of the multipliers 108. For example, a 480 MHz signal sample stream can be presented at a 120 MHz rate by providing groups of four signal samples in parallel. Since the filter operates on each set of four samples simultaneously, the multipliers need only operate at a 120 MHz rate. Hence, when signal samples are received in groups of M parallel signal samples, the clock rate of the multipliers may be set to operate at (l/M) the sample rate. In accordance with this principle, samples rates in excess of the basic multiplier rate can be accommodated. Further reductions in the clock rate of the multipliers may be provided through other exemplary embodiments as described below.

Figure 5:
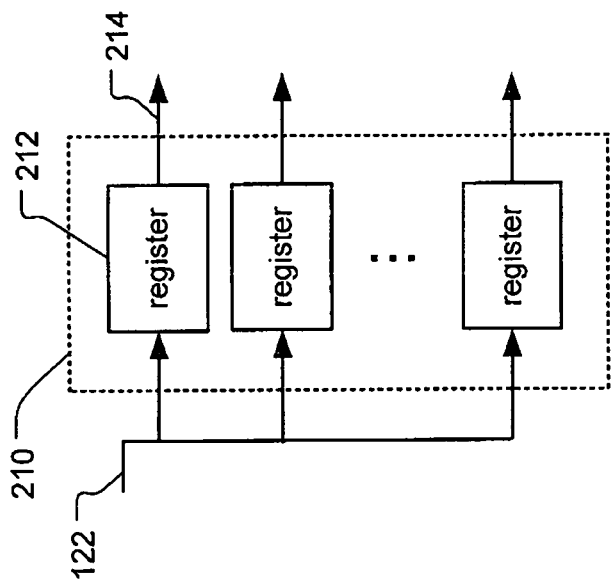
FIG. 5 is a block diagram of an output parallelizer in accordance with an embodiment of the present invention.

The filter 100 may optionally include an output parallelizer to convert the decimated filter output into a parallel stream. For example, as illustrated in FIG. 5, in accordance with an embodiment of the present invention, the output parallelizer 210 may include a plurality of registers 212. As individual decimated filter outputs 122 are produced by the filter 100, each decimated filter output may be stored in a register. When a group of decimated filter outputs has been stored in the parallelizer, the entire group of decimated filter outputs may then be provided at the outputs 214 of the parallelizer substantially simultaneously. Of course, as will be understood by one of skill in the art, slight variations in the output timing, for example due to propagation delay variations, may occur. Including an output parallelizer can provide for a reduction in the clock rate required by circuitry following the filter.

The filter 100 may provide a single filter output for each group of M parallel-received signal samples. In such a case, the filter performs decimation by M. Larger decimation factors can also be accomplished, for example by providing a filter output every $k^{th}$ group of parallel-received signal samples, where k is a positive integer (k=1, 2, 3, . . . ) in which case the decimation factor is k*M. Changes of the decimation factor during operation can also be accomplished.

The filter 100 may include multiple filter sections 118. Longer filter impulse response lengths may be accommodated by including more filter sections. For example, consider a filter of length N, where the signal samples are provided in parallel groups of M samples. The filter can be implemented using L=N/M filter sections, where L is rounded up to the nearest integer. For filter coefficients $\{h_i\}$, i=0 . . . N−1, the first section is provided coefficients $h_0$ . . . $h_{M-1}$, the next section $h_M$ . . . $h_{2M-1}$, and so on, with the last section provided $h_{N-M}$ . . . $h_{N-1}$. Further detail on the filter coefficients is provided below. In a typical application, the filter length is chosen to be larger than the decimation factor, in which case multiple filter sections 118 may be used. Hence, one significant benefit provided by the filter is the ability to implement filters having a desired filter impulse response longer than the decimation factor.

Operation of the filter 100 will be made clearer by an example. Consider an implementation using a parallel input of M=3, a filter length of N=9, and a decimation factor of 6. Hence, three filter sections 118 are used to implement the filter. The three filter sections are designated the "upper," "middle" and "lower" corresponding to their relative positions in FIG. 1. Operation of the filter as a function of time is illustrated in FIG. 6. The first column is a time index, which in this example is the timing of the parallel-received signal samples. In other words, one set of signal samples is received each time interval; time interval 1, signal samples $x_0$, $x_1$, and $x_2$ are received, and at time interval 2, signal samples $x_3$, $x_4$, and $x_5$ are received, and so forth. The coefficients supplied to the multipliers are constant for this particular example as shown in the third column of FIG. 6. The resulting partial sums 116 (FIG. 1) are shown for each of the three filter sections in the fourth through sixth columns of FIG. 6. The final column of FIG. 6 shows the decimated filter output 122 (FIG. 1), which is formed from the differentially delayed and added partial sums. For example, the decimated filter output at time interval 3 is formed from the sum of the upper partial sum from time interval 3, the middle partial sum from time interval 2, and the lower partial sum from time interval 1. Similarly, the decimated filter output at time interval 5 is formed from the sum of the upper partial sum from time interval 5, the middle partial sum from time interval 4, and the lower partial sum from time interval 3. As will occur to one of skill in the art in possession of this disclosure, many different ordering of the signal samples, coefficients, and the direction of the summing tree daisy chain can be made without affecting the basic operation of the filter as just described. Decimation by 6 is provided in that a decimated filter output is provided every other time interval, corresponding to one decimated filter output for each 6 signal samples.

For the particular example just described, some of the multipliers and summers are idle during some time intervals. This is not always the case. For example, if the decimation factor is set equal to the parallelism (for instance, M=3 for the above example), all of the multipliers and summers will be active each time interval. Operation of the filter in such a mode will be apparent to one of skill in the art based on the above description, and is thus omitted for the sake of brevity.

Figure 7:
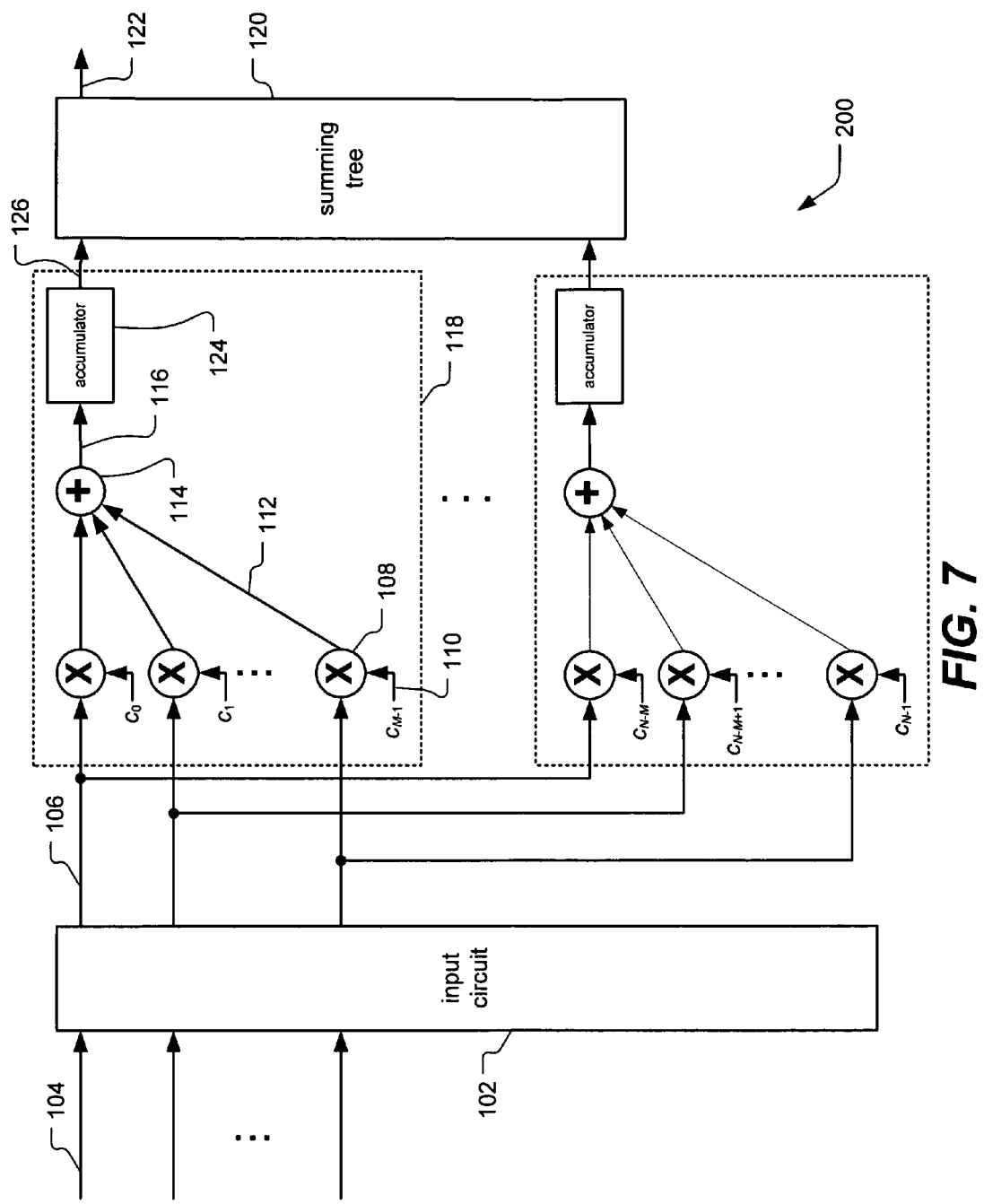
FIG. 7 is a block diagram of a decimating transpose form finite impulse response filter in accordance with an embodiment of the present invention.

An alternate structure of a decimating transpose form FIR filter 200 is shown in FIG. 7, in accordance with an embodiment of the present invention. The filter includes a plurality of accumulators 124 disposed between the summers 114 and summing tree 120. The accumulators accumulate the partial sums 116 to form an accumulated partial sum 126. By including the accumulators, operation of the filter when decimating can be enhanced. For example, when the decimation factor is greater than the parallelism, M, the multipliers 108 can be used to multiply each signal sample by more than one coefficient and accumulating the multiple partial sums 116 in the accumulators. Of course, if the accumulators are used in a pass-through mode (that is, where no accumulation is performed), operation of the filter is the same as that of the filter described in FIG. 1. Various ways of implementing the accumulators 124 will occur to one of skill in the art. For example the accumulators may be implemented as an integrate-and-dump, or by using a summer with feedback and a reset.

An example of operation of the filter 200 will be illustrated using the same parameters as discussed previously: parallelism of M=3, filter length of N=9, and decimation by 6. Two filter sections are used for this implementation (an "upper" and "lower"). Operation is as shown in FIG. 8. The first two columns are identical to FIG. 6, showing the time interval and signal samples. As can be seen in column three, different coefficients are used during each time interval, since the multipliers are reused to compute different products during each time interval. The fourth column shows the partial sum for the upper filter section, which is also the output from the upper accumulator. The upper accumulator is operated in pass-through mode, since no accumulation is needed in the upper filter section. Optionally, the upper accumulator could be eliminated or replaced with a register. The fifth column shows the partial sum for the lower filter section, and the sixth column shows the lower accumulator output. The resulting decimated filter output is the last column, and can be seen to be identical to FIG. 8. Each decimated filter output consists of three partial sums, two that are computed by the lower filter section and accumulated in the lower accumulator, and one that is computed by the upper filter section.

It can be observed in FIG. 8 that the multipliers of the upper filter section are idle every other time interval. Hence, using the same number of filter sections as the example just illustrated, a filter of length N=12 can also be implemented. In such a case, the upper section multiplies by $h_5$, $h_4$, $h_3$ and $h_2$, $h_1$, $h_0$ in alternate time intervals, and the lower section alternately multiplies by $h_{11}$, $h_{10}$, $h_9$ and $h_8$, $h_7$, $h_6$. Each decimated filter output consists of four partial sums, two each computed by the upper and lower filter sections.

The filter 200 (FIG. 7) provides a benefit in using fewer multipliers when decimation is performed. For example, a filter of length N with M parallel signal samples can be realized using L=(1/F)*(N/M) filter sections, where F*M is the decimation factor and L is rounded up to the nearest integer. Hence, it can be seen that the filter provides an efficient use of hardware when the decimation factor is large. For example, for a decimation factor of 5000, a filter length of N=10000 may be needed. If signal samples are provided with a parallelism of M=4, then F=1250. The number of sections needed is thus 2.

Additional benefits in scalability also result. For a given number of filter sections, a filter can provide a flexible range of different decimation factors and filter lengths. For example, a filter of P sections can provide a filter length of F*M*P. Hence, for example if P=2, filter lengths of twice the decimation factor can be accomplished, with decimation factors ranging from a minimum of M, to a virtually unlimited number. Hence, a significant benefit is provided in that a fixed number of filter sections can provide a flexible decimation factor. Furthermore, the decimation factor can be changed during operation, since changes in the filter structure are not necessary to accommodate a different decimation factor.

One consideration in the selection of the filter parameters (F, M, N, and P) for either filter 100, 200 just described is the precision (bit-width) provided in a digital implementation. As is known to one of skill in the art, as digital samples are added together in a filter, the dynamic range (bit-width needed to represent samples) can increase. Generally, as longer filters are used, wider bit-widths may be preferred in the summing tree and accumulators. Optionally, the filter may include scaling stages to manage the dynamic range. For example, in one embodiment using M=2 parallelism, signal samples may be represented by 10 bit digital words, products by 18 bits, partial sums by 19 bits, accumulated partial sums by 32 bits, partial results by 34 bits, and the decimated filter output by 34 bits. Least significant bits may thus optionally be truncated by the scaling stages.

Figure 10:
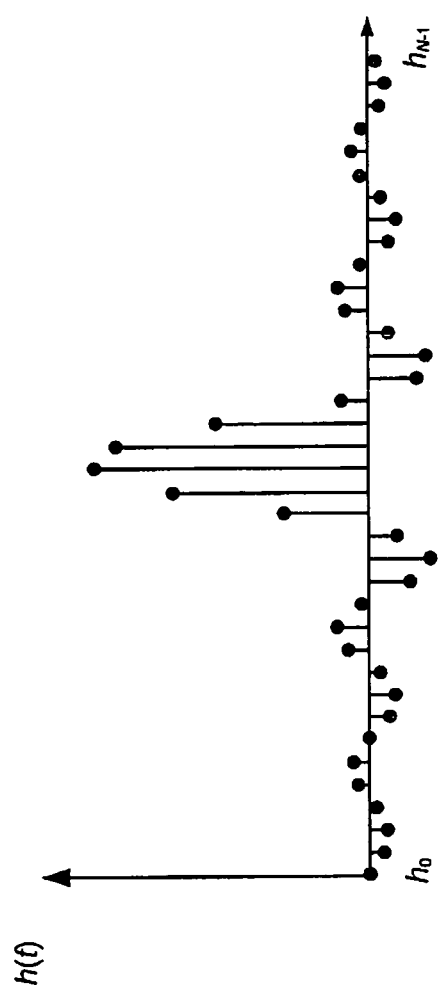
FIG. 10 is an illustration of a desired filter impulse response in accordance with an embodiment of the present invention.

We now turn our attention to the coefficient memory in further detail. For example, FIG. 9 illustrates a coefficient memory 250, in accordance with an embodiment of the present invention. The coefficient memory is configured to store a plurality of coefficients which define a desired filter impulse response. For example, one exemplary filter impulse response is illustrated in FIG. 10. The filter response, designated by coefficients $\{h_i\}$, i=0 . . . N−1, may be stored in the coefficient memory in order, and output as $c_0 \ldots c_{n-1}$.

Optionally, the coefficient memory 250 may include several different filter responses as illustrated in FIG. 11. Depending on which set of coefficients is used, the filter response may accordingly be altered. The different filter responses need not all use the same number of taps. By selecting which filter coefficients are provided to the multiplier, any of the filter responses may be used at any time by the filter, and changes in the filter response implemented in real time. Various ways of selecting which filter response is used will occur to one of skill in the art. For example, coefficients for each filter response can be stored sequentially in the memory, starting at different base addresses. A filter response may then be selected by using the base address and offsets for the particular coefficients.

The coefficient memory 250 can also be used to accommodate a wide range of decimation factors. For example, a low pass filter response is generally used when decimating. Low pass filtering helps to prevent aliasing which may be introduced by the decimation process. The filter response is generally determined based on a variety of factors, including the decimation factor, the input signal characteristics, and the desired fidelity. For example, high rejection is usually desirable for frequencies above one-half the decimated signal sample rate (the "cutoff frequency"). Hence, the desired filter cutoff frequency may scale with the decimation factor, requiring a correspondingly longer filter (with lower cutoff frequency) as the decimation factor is increased.

Various techniques for implementing the coefficient memory will occur to one of skill in the art. For example, the coefficient memory may be implemented by a random access memory (RAM), such as a RAM block in a field programmable gate array or application specific integrated circuit. The coefficient memory may be implemented as a dual port memory, providing access to a control processor through one port (allowing programming of the filter response), and providing coefficients to the multipliers through the other port. Alternately, the multiple ports of a multi port memory may be used to simultaneously provide multiple coefficients to the multipliers.

In one exemplary embodiment of the present invention, a wide range of decimation factors can be supported using a coefficient memory having one desired filter impulse response. The desired filter impulse response (e.g., the low pass filter coefficients shown in FIG. 10) may be stored in the coefficient memory. The filter impulse response may correspond to a long filter (many taps) as used for a high decimation factor. For lower decimation factors, a filter with a similar, but scaled frequency response is used, which corresponds to taking a subset of the desired filter impulse response coefficients.

To provide a more specific example, the filter response may include 5,000 coefficients. For decimation by 2500, the entire filter response may be used. For other decimation factors, a subset of the coefficients is used. For example, for decimation by 1250, every other coefficient in the filter response may be used; for decimation by 625, every fourth coefficient is used. For small decimation factors, few coefficients are needed: for decimation by 2, every $1250^{th}$ coefficient is used (total of 4 coefficients). Optionally, if no decimation is performed, every $2500^{th}$ coefficient is used (total of 2 coefficients). Optionally, coefficients may also be reused to simulate a longer filter than the number of coefficients provided. For example, a filter of length 10,000 may be implemented by reusing every filter coefficient twice. As will be apparent from the foregoing to one of skill in the art, the resulting response of the finite impulse response filter as just described will be to produce a filter having a frequency scaled version of the desired frequency response, where the scaling is based on the selected decimation factor.

To implement the coefficient memory as just described, the filter coefficients can be selected by stepping through the coefficient memory with a step size that is a function of the decimation factor. The step size may be an integer number, in which case coefficients are skipped resulting in a shorter filter response, or the step size may be a fraction, in which case coefficients are reused resulting in a longer filter response. Changing the decimation factor during operation is thus enhanced, since the same coefficient memory can be used with a change in the step size.

Figure 12:
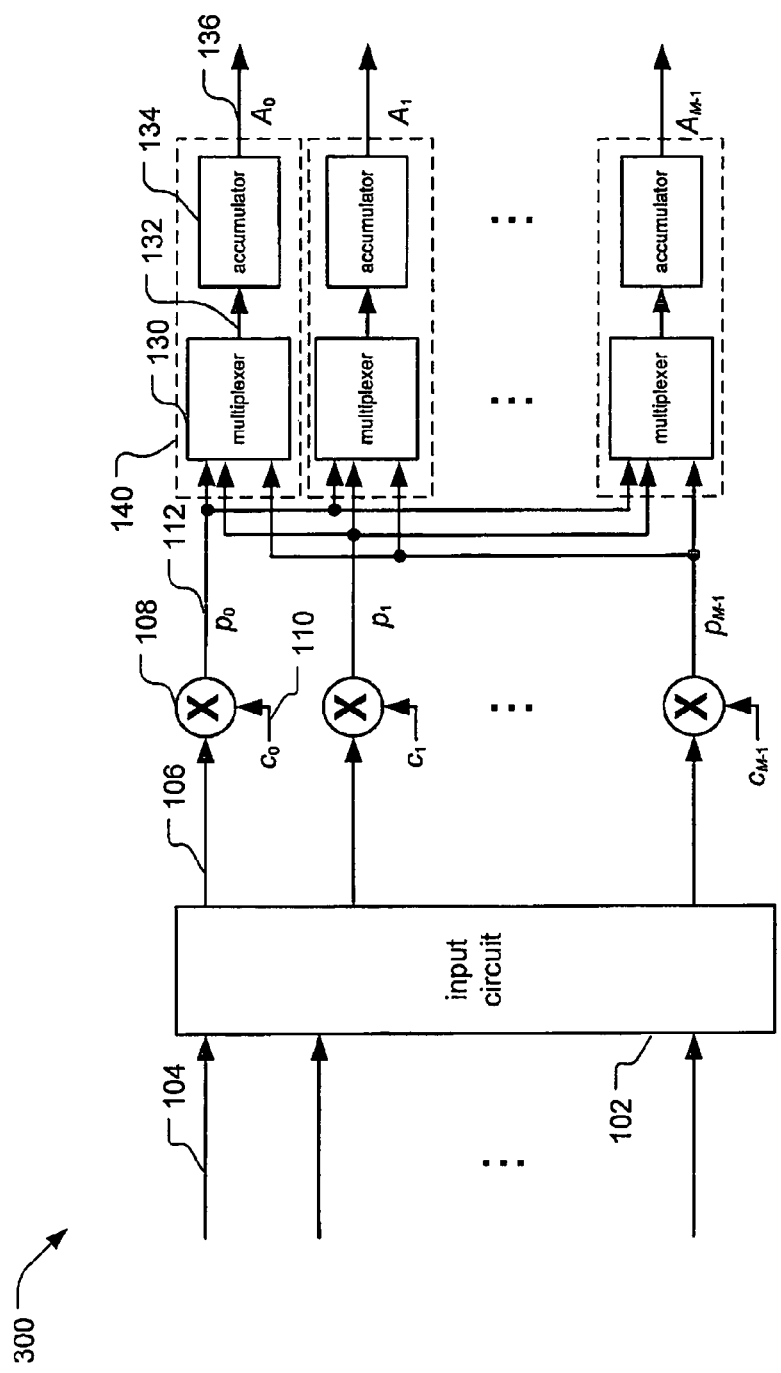
FIG. 12 is a block diagram of a flexible finite impulse response filter in accordance with an embodiment of the present invention.

An alternate arrangement of the filter also provides for a wide range of decimation factors, including decimation by less than the parallelism, M. FIG. 12 illustrates a flexible finite impulse response filter 300 in accordance with another embodiment of the present invention. The filter includes an input circuit 102 and multipliers 108, configured to receive in parallel signal samples which are multiplied by coefficients 110 to produce products 112, similar as described previously for other embodiments of the present invention. The filter also includes multiplexers 130, each coupled to a plurality of the multipliers, and configured to select one of the products which are output as a multiplexed product 132. The filter also includes accumulators 134 coupled to the multiplexers and configured to accumulate the multiplexed products 132 to form filter outputs 136. Each combination of a multiplexer and an accumulator can be referred to as a filter section 140. The number of filter sections may be equal to, more, or less than the number of parallel inputs.

Operation of the filter 300 is best explained by a series of examples. First, we consider where the filter is set up for decimation by 1. Hence, for each M signal samples 104 provided to the filter, the filter will produce M filter outputs 136. The number of sections used is L=4 with a filter length of N=4. The operation in this mode is illustrated in FIG. 13 which shows the coefficient 110 for each multiplier 108, the multiplexer product 132, and resulting filter outputs 136. The first column of FIG. 13 shows a time index. The second column shows the parallel-received signal samples 106. Note that there are four time intervals for each set of parallel-received signal samples (the time interval corresponds to the output sample period, which will become apparent shortly). The third column shows the coefficients applied to the multipliers, and the fourth column shows the resulting products ($p_i i=1 \ldots M-1$). The fifth column shows the selections of the four multiplexers, that is, which of the products are selected for output from each multiplexer. The sixth through ninth columns show the accumulator contents ($A_i$, $i=1 \ldots M-1$). The final column shows which accumulator output provides a filter output at each time interval.

Each time interval, the parallel-received signal samples 106 are multiplied by different coefficients 110, and a different product 112 is selected by each multiplexer 130. Looking first at accumulator $A_0$, over time intervals 1 through 4, accumulator $A_0$ accumulates products to form a filter output available at time interval 4 which spans signal samples $x_0$ through $x_3$. Similarly, over time intervals 2 through 5, accumulator $A_1$ accumulates products to form a filter output available at time interval 5 which spans signal samples $x_1$ through $x_4$. It can be seen that each time interval, one of the four accumulators will have completed a filter computation and have available a filter output.

Figure 14:
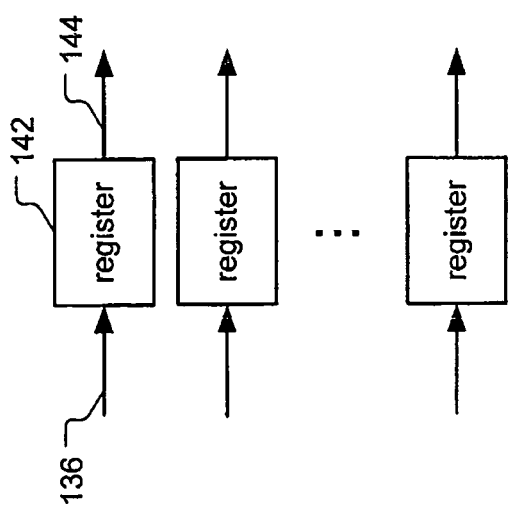
FIG. 14 is a block diagram of registers in accordance with an embodiment of the present invention.

Although the filter outputs are available in a parallel form, the outputs are not all available simultaneously. As shown in FIG. 14, in accordance with an embodiment of the present invention, a set of registers 142 can be coupled to the filter outputs 136 to hold the filter outputs until a complete set of filter outputs is available from each filter section 140 (FIG. 12). Each output register is clocked at the appropriate time to transfer the filter output from the accumulator 134 to the register. Hence, parallel filter outputs 144 can be provided by the filter.

Figure 15:
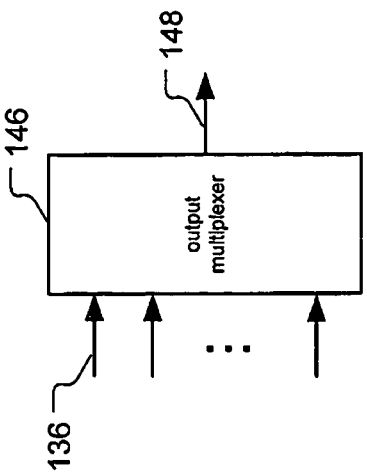
FIG. 15 is a block diagram of an output multiplexer in accordance with an embodiment of the present invention.

Alternately, the filter outputs can be converted to serial form. As shown in FIG. 15, in accordance with an embodiment of the present invention, the filter may include an output multiplexer 146 coupled to the plurality of accumulators 134 (FIG. 12). The output multiplexer accepts the filter outputs 136 from the accumulators and outputs them sequentially in time at the serial output 148.

Continuing with the discussion of the flexible decimation FIR filter 300 (FIG. 12), we consider a second decimation example, where decimation by 3 is performed. As for the first example, the input parallelism is M=4 and the filter length is N=4. FIG. 16 illustrates the operation in this mode, where two filter sections are used: accumulator $A_0$ and accumulator $A_1$. From time intervals 1 through 4, the filter output at time 4 is computed by accumulator $A_0$, spanning samples $x_0$ through $x_3$. From time intervals 4 through 7, the filter output at time 7 is computed by accumulator $A_1$, spanning samples $x_3$ through $x_6$. As can be seen, a new filter output 136 is produced every 3 time intervals, alternating between $A_0$ and $A_1$. Output registers 142 (FIG. 14) or an output multiplexer 146 (FIG. 15) may be included to provide time aligned parallel or serial output, respectively, as described for the first example.

Finally, as a third example, we use M=4 again, but consider a decimation by 2 filter with a length of N=6. For this case, three sections are used (accumulators A0, A1, and A2). The operation is illustrated in FIG. 17. The assignments for the coefficients and multiplexing are more complex than the previous examples, but are still regular. As for the previous examples, the filter outputs are available from different accumulators at different times. Hence, an output multiplexer or register set may be used as described above. Various alternative arrangements for the order in which the products are computed are possible, as will occur to one of skill in the art in light of the foregoing examples.

As can be seen from these three examples, the flexible FIR filter 300 can provide decimation by j, where j is a positive integer, arbitrarily selected with respect to the input parallelism M. Hence, the filter provides the simultaneous advantages of providing a lower input clock rate (through the parallel input) and flexible decimation factors. For example, a filter having four filter sections 140 can operate in any of the previous three examples without requiring any structural changes.

Turning now to the implementation of the previously described embodiments of the invention, many alternatives are available. For example, any of the filters 100, 200, 300 may be implemented in programmable logic, including one-time programmable and re-programmable field programmable gate arrays (FPGA), such as a Xilinx Virtex-II™ series FPGA. Alternately, the filter may be implemented in a gate array or custom logic, such as an application specific integrated circuit (ASIC). In yet another implementation, the filter can be implemented using a general purpose processor or digital signal processor.

Many techniques for implementing the various components, such as the multipliers, summers, accumulators, multiplexers, and coefficient memory will occur to one of skill in the art. For example, a multiplier can be implemented in digital logic in many ways, including combinatorial logic, a state machine, or a lookup table. Furthermore, components can be implemented in a hardware description language, such as Verilog™ or VHDL in either behavioral or structural descriptions (sometimes also referred to as soft or hard macros). Hardware description language may provide for bit widths, number of sections, and parallelism to be configurable parameters which are specified by a designer at synthesis time.

Figure 18:
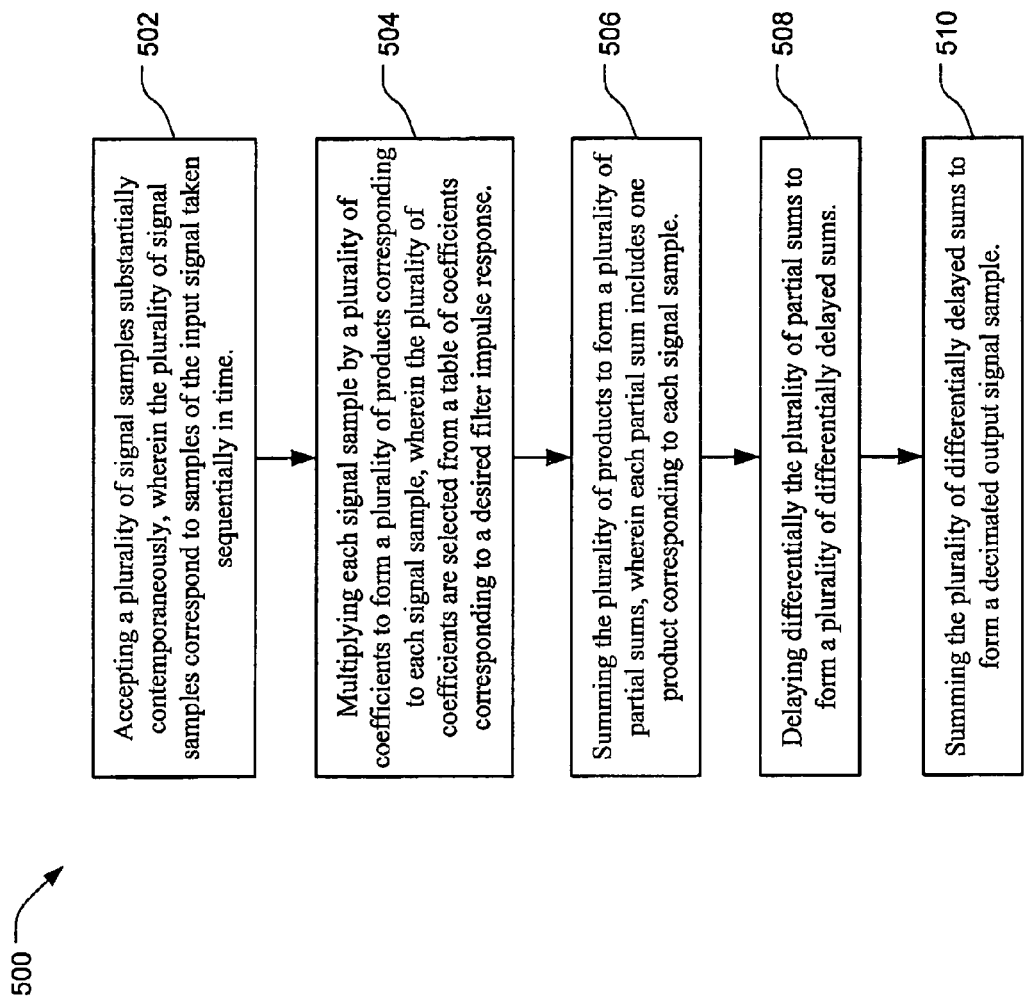
FIG. 18 is a flowchart of a method for decimating an input signal by a decimation factor in accordance with an embodiment of the present invention.

In accordance with another embodiment of the present invention, a method 500 for decimating an input signal by a decimation factor is illustrated in flow chart form in FIG. 18. A first step of the method is accepting 502 a plurality of signal samples substantially contemporaneously. As described above, the plurality of signal samples correspond to samples of the input signal taken sequentially in time. A second step of the method is multiplying 504 each signal sample by a plurality of coefficients to form a plurality of products. A plurality of products is computed for each signal sample. Each product uses a different coefficient, where the coefficients are selected from a table of coefficients corresponding to a desired filter impulse response. For example, the coefficients may be obtained by stepping through the table of coefficients with a step size based on the decimation factor as described above.

A third step of the method 500 is summing 506 the plurality of products to form a plurality of partial sums. Each partial sum includes one product corresponding to each signal sample. A fourth step of the method is delaying 508 differentially the plurality of products to form a plurality of partial sums. Each partial sum thus includes one product corresponding to each signal sample. A fifth step of the method is summing 510 the plurality of differentially delays sums to form a decimated output signal sample. Optionally, the method may also include outputting in parallel form a plurality of decimated output signals.

Figure 19:
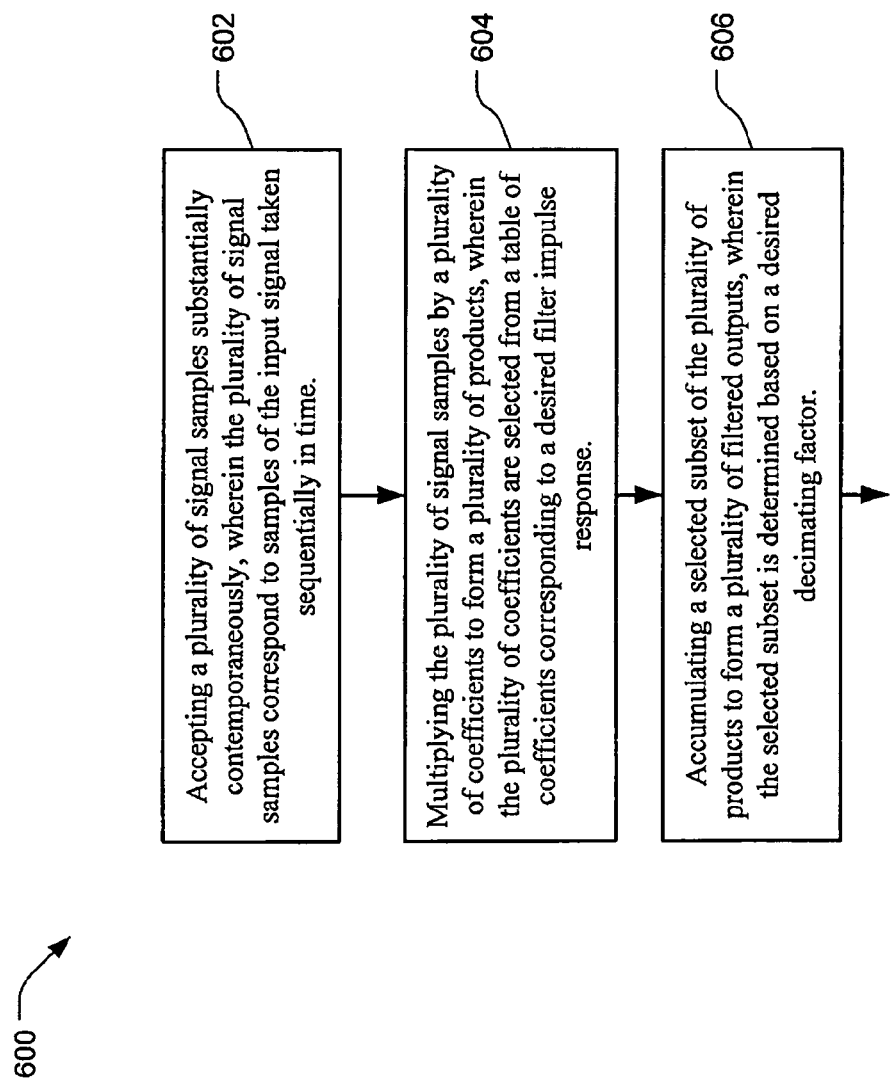
FIG. 19 is a flowchart of a method for filtering an input signal by a filter having a desired filter impulse response in accordance with an embodiment of the present invention.

In accordance with another embodiment of the present invention, a method 600 for filtering an input signal by a filter having a desired filter impulse response is illustrated in flow chart form in FIG. 19. A first step of the method is accepting 602 a plurality of signal samples substantially contemporaneously. As described above, the plurality of signal samples correspond to samples of the input signal taken sequentially in time. A second step of the method is multiplying 604 the plurality of signal samples by a plurality of coefficients to form a plurality of products. The coefficients are selected from a table of coefficients corresponding to a desired filter impulse response. For example, the coefficients may be obtained by stepping through the table of coefficients with a step size based on the decimation factor as described above.

A third step of the method 600 is accumulating 606 a selected subset of the plurality of products to form a plurality of filtered outputs. Which subset is determined based on a desired decimation factor. For example, see the discussion of FIGS. 13, 16, and 17 above. Optionally, the method may also include outputting the plurality of filtered outputs substantially contemporaneously. Alternately, the method may optionally include outputting the plurality of filtered outputs sequentially in time.

It is to be understood that the above-referenced arrangements are illustrative of the application for the principles of the present invention. It will be apparent to those of ordinary skill in the art that numerous modifications can be made without departing from the principles and concepts of the invention as set forth in the claims.

What is claimed is:

1. A decimating transpose form finite impulse response filter for filtering an input signal comprising:
   an input circuit configured to receive in parallel a plurality of signal samples corresponding to sequential samples of the input signal;
   a plurality of multipliers coupled to the input circuit and configured to multiply the plurality of parallel-received signal samples by a plurality of coefficients to produce a plurality of products, whereby each product corresponds to a particular one of the plurality of signal samples, and each one of the parallel-received signal samples is multiplied by a plurality of different coefficients in parallel;
   a plurality of summers coupled to the multipliers and configured to sum the products corresponding to different ones of the plurality of parallel-received signal samples to form a plurality of partial sums;
   a summing tree coupled to the plurality of summers and configured to differentially delay and sum the plurality of partial sums to form a decimated filter output, wherein the partial sums are delayed relative to each other to time align each of the plurality of partial sums corresponding to a decimated filter output for a same time.

2. The decimating transpose form finite impulse response filter of claim 1 wherein the summing tree is further configured to form a decimated filter output by providing the filter output once for each plurality of parallel-received signal samples.

3. The decimating transpose form finite impulse response filter of claim 1 wherein the summing tree comprises a plurality of daisy-chained delay-and-add units coupled to the plurality of summers and configured to add the corresponding partial sums to a partial result delayed and passed between the delay-and-add units so that a last delay-and-add unit outputs the decimated filter output.

4. The decimating transpose form finite impulse response filter of claim 1 wherein the input circuit comprises a plurality of registers.

5. The decimating transpose form finite impulse response filter of claim 1 further comprising a plurality of accumulators disposed between the summers and summing tree and configured to accumulate a plurality of partial sums and output a plurality of accumulated partial sums to the summing tree, wherein the summing tree is further configured to differentially delay and sum the plurality of accumulated partial sums to form the decimated filter output.

6. The transpose form finite impulse response filter of claim 5 wherein a decimation factor of the transpose form finite impulse response filter is equal to a positive integer k times the number M of parallel-received samples.

7. The decimating transpose form finite impulse response filter of claim 1 further comprising a coefficient memory coupled to the plurality of multipliers and configured to supply the plurality of coefficients to the plurality of multipliers, wherein the plurality of coefficients defines a desired filter impulse response.

8. The decimating transpose form finite impulse response filter of claim 7 wherein the plurality of coefficients supplied to the plurality of multipliers are a subset of the desired filter impulse response based on a decimation factor.

9. The decimating transpose form finite impulse response filter of claim 1 further comprising a parallelizer coupled to the summing tree and configured to sequentially accept a plurality of the decimated filter outputs and output the plurality of filter outputs substantially contemporaneously.

10. The decimating transpose form finite impulse response filter of claim 1 wherein the plurality of signal samples are in a digital format.

11. A flexible finite impulse response filter for filtering an input signal comprising:
    an input circuit configured to receive in parallel a plurality of signal samples corresponding to sequential samples of the input signal;

a plurality of multipliers coupled to the input circuit and configured to multiply the plurality of parallel-received signal samples by a plurality of coefficients to produce a plurality of products;

a plurality of multiplexers, each coupled to the plurality of multipliers and configured to select a product from one of the plurality of multipliers and output a multiplexed product; and a plurality of accumulators coupled to the multipliers and configured to sum the multiplexed products to form a plurality of filter outputs, wherein the multiplexed products provided to each accumulator correspond to a filter output for a same time.

12. The flexible finite impulse response filter of claim 11 further comprising a plurality of output registers coupled to the plurality of accumulators and configured to output the plurality of filter outputs substantially contemporaneously.

13. The flexible finite impulse response filter of claim 11 further comprising an output multiplexer coupled to the plurality of accumulators and configured to output the plurality of filter outputs sequentially in time.

14. The flexible finite impulse response filter of claim 11 further comprising a coefficient memory coupled to the plurality of multipliers and configured to supply the plurality of coefficients to plurality of multipliers, wherein the plurality of coefficients define a desired filter impulse response.

15. The flexible finite impulse response filter of claim 11, wherein for each plurality of parallel-received signal samples an equal number of filter outputs are produced.

16. The flexible finite impulse response filter of claim 11, wherein one filter output is produced for each positive integer j number of signal samples, j≥1.

17. A decimating, transpose form finite impulse response filter for filtering and decimating an input signal by a decimation factor selected from a plurality of decimation factors, comprising:

an input circuit configured to receive samples of the input signal;

a plurality of multipliers coupled to the input circuit and configured to multiply each sample by a subset of at least two different filter response coefficients, the multipliers producing a plurality of products;

a summing tree, coupled to the plurality of multipliers and configured to differentially delay and sum the plurality of products to form a filter output, wherein the plurality of products are delayed relative to each other to time align each of the plurality of products corresponding to a decimated filter output for a same time; and a coefficient memory coupled to the plurality of multipliers and configured to store a plurality of filter response coefficients corresponding to a desired filter response and to output the subset of filter response coefficients to the plurality of multipliers, wherein the subset of filter response coefficients is selected from the plurality of the filter response coefficients based on the selected decimation factor.

18. The decimating, transpose form finite impulse response filter of claim 17, wherein the subset of filter response coefficients is selected from the plurality of filter response coefficients so that the subset of filter response coefficients correspond to a frequency scaled version of the desired frequency response, wherein the scaling is based on the selected decimation factor.

19. The decimating, transpose form finite impulse response filter of claim 17, wherein the subset of filter response coefficients is selected from the plurality of filter response coefficients by stepping through the coefficient memory with a step size based on the selected decimation factor.

20. The decimating, transpose form finite impulse filter of claim 17, wherein the coefficient memory further comprises a plurality of desired filter responses.

21. The decimating, transpose form finite impulse filter of claim 17, wherein the input circuit is further configured to substantially contemporaneously receive a plurality of signal samples corresponding to a series of sequential samples of the input signal.

22. A method of decimating an input signal by a decimation factor comprising:

accepting a plurality of M signal samples substantially contemporaneously, wherein the plurality of signal samples correspond to samples of the input signal taken sequentially in time;

multiplying each signal sample by a plurality of coefficients to form a plurality of products corresponding to each signal sample, wherein the plurality of coefficients are selected from a table of coefficients corresponding to a desired filter impulse response;

summing the plurality of products to form a plurality of partial sums, wherein each partial sum includes one product corresponding to each signal sample;

delaying differentially the plurality of partial sums to form a plurality of differentially delayed sums, wherein the partial sums are delayed relative to each other to time align each of the plurality of partial sums corresponding to a decimated filter output for a same time; and summing the plurality of differentially delayed sums to form a decimated output signal sample.

23. The method of claim 22 further comprising outputting in parallel form a plurality of decimated output signals.

24. The method of claim 22 further comprising selecting the plurality of coefficients from the table of coefficients by stepping through the table of coefficients with a step size based on the decimation factor.

25. The method of claim 22 wherein the decimation factor is k*M, where k is a positive integer, k≥1.

26. A method of filtering an input signal by a filter having a desired filter impulse response comprising:

accepting a plurality of signal samples substantially contemporaneously, wherein the plurality of signal samples correspond to samples of the input signal taken sequentially in time;

multiplying the plurality of signal samples by a plurality of coefficients to form a plurality of products, wherein the plurality of coefficients are selected from a table of coefficients corresponding to a desired filter impulse response; and accumulating a selected subset of the plurality of products to form a plurality of filtered outputs, wherein the selected subset is determined based on a desired decimation factor and the selected subset corresponds to a filter output for a same time.

27. The method of claim 26 further comprising outputting sequentially the plurality of filtered outputs.

28. The method of claim 26 further comprising outputting substantially contemporaneously the plurality of filtered outputs.

29. The method of claim 26 further comprising selecting the plurality of coefficients from the table of coefficients by stepping through the table of coefficients with a step size based on the decimation factor.

30. The method of claim 26 wherein the decimation factor is 1.

31. The method of claim 26 wherein the decimation factor is an integer j, j>0.

* * * * *